(12) United States Patent
Oren

(10) Patent No.: US 11,906,434 B2
(45) Date of Patent: *Feb. 20, 2024

(54) RAMAN SPECTROSCOPY BASED MEASUREMENT SYSTEM

(71) Applicant: NOVA LTD, Rehovot (IL)

(72) Inventor: Yonatan Oren, Kirya Ono (IL)

(73) Assignee: NOVA LTD., Rehovot (IL)

( * ) Notice: Subject to any disclaimer, the term of this patent is extended or adjusted under 35 U.S.C. 154(b) by 0 days.

This patent is subject to a terminal disclaimer.

(21) Appl. No.: 17/714,035

(22) Filed: Apr. 5, 2022

(65) Prior Publication Data

US 2022/0373465 A1 Nov. 24, 2022

Related U.S. Application Data

(63) Continuation of application No. 16/613,448, filed as application No. PCT/IL2018/050531 on May 15, 2018, now Pat. No. 11,293,871.

(60) Provisional application No. 62/505,999, filed on May 15, 2017.

(51) Int. Cl.
*G01N 21/65* (2006.01)
*G01N 21/95* (2006.01)
*G03F 7/00* (2006.01)

(52) U.S. Cl.
CPC ......... *G01N 21/65* (2013.01); *G01N 21/9501* (2013.01); *G03F 7/70616* (2013.01); *G01N 2201/0231* (2013.01); *G01N 2201/06113* (2013.01)

(58) Field of Classification Search
CPC .... G01N 21/65; G01N 21/9501; G01N 21/17; G01N 2201/0231; G01N 2201/06113; G03F 7/70616; G03F 7/70625; G01B 2210/56; G01B 11/02
See application file for complete search history.

(56) References Cited

U.S. PATENT DOCUMENTS

| | | | |
|---|---|---|---|
| 5,844,684 A | 12/1998 | Maris et al. | |
| 7,414,721 B1 | 8/2008 | Suvkhanov et al. | |
| 9,778,194 B2 | 10/2017 | Tomar et al. | |
| 11,293,871 B2 * | 4/2022 | Oren | G03F 7/70625 |
| 2006/0049480 A1 | 3/2006 | Naka et al. | |
| 2009/0001262 A1 | 1/2009 | Visser et al. | |
| 2009/0309623 A1 | 12/2009 | Holland et al. | |
| 2014/0268130 A1 | 9/2014 | Omichi et al. | |
| 2014/0311953 A1 * | 10/2014 | Chimenti | C10G 75/00 356/402 |
| 2016/0223463 A1 | 8/2016 | Schmidt et al. | |

(Continued)

*Primary Examiner* — Tarifur R Chowdhury
*Assistant Examiner* — Carlos Perez-Guzman
(74) *Attorney, Agent, or Firm* — Reches Patents

(57) ABSTRACT

A method and system are presented for use in measuring one or more characteristics of patterned structures. The method comprises: performing measurements on a patterned structure by illuminating the structure with exciting light to cause Raman scattering of one or more excited regions of the pattern structure, while applying a controlled change of at least temperature condition of the patterned structure, and detecting the Raman scattering, and generating corresponding measured data indicative of a temperature dependence of the detected Raman scattering; and analyzing the measured data and generating data indicative of spatial profile of one or more properties of the patterned structure.

15 Claims, 4 Drawing Sheets

(56) References Cited

U.S. PATENT DOCUMENTS

2017/0219489 A1 8/2017 Cheshnovsky et al.
2018/0372644 A1 12/2018 Barak et al.

* cited by examiner

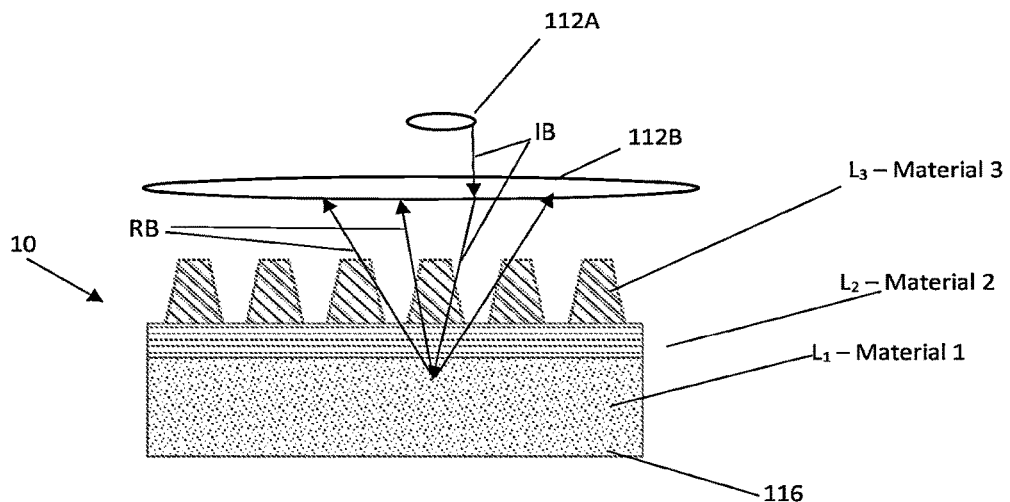
FIG. 4A
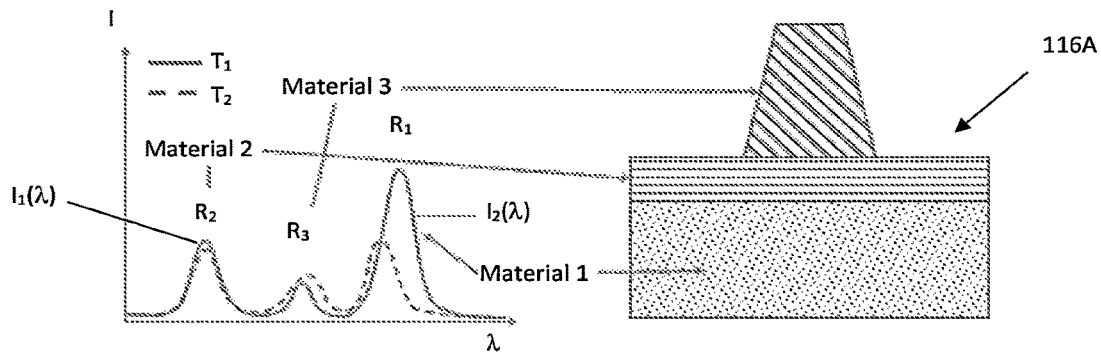
Fig. 4C
Fig. 4B
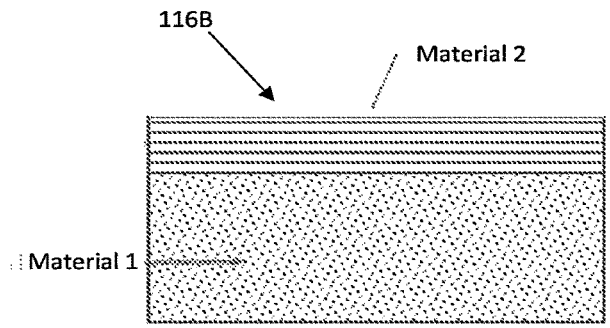
Fig. 4D
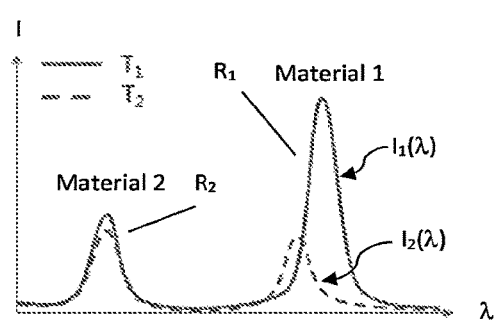
Fig. 4E

RAMAN SPECTROSCOPY BASED MEASUREMENT SYSTEM

TECHNOLOGICAL FIELD AND BACKGROUND

The present invention is in the field of optical measurement technique, and relates to optical system and method for measuring in patterned structures. The invention is particularly useful in metrology applications, used for example in semiconductor industry.

For several decades, semiconductor technology has been progressing by shrinking the size of devices, leading to impressive improvements in performance and cost. However as computing increasingly becomes mobile, embedded and even wearable, an additional requirement emerges for improvement in power efficiency. Because electrical resistance is inversely proportional to the cross sectional area of a conductor, and power consumption is proportional to the number of transistors on a chip, the traditional approach of geometrical shrinking is quickly becoming unable to reconcile these two demands.

A solution to this problem which is increasingly adopted by the semiconductor industry lies in manipulating not only the dimensions, but also the material properties of devices— both intrinsic properties such as composition, and extrinsic such as applied stress. This has been shown to produce a dramatic increase in the mobility of charge carriers, and thus allows the continued scaling of devices without prohibitive increases in power consumption.

This emerging focus on material engineering makes material oriented metrology in general, and Raman Spectroscopy in particular, important tools for process optimization and control. The main advantage of Raman Spectroscopy is its direct sensitivity to material properties like composition, stress/strain, crystallinity etc. Raman Spectroscopy works by probing vibrational modes of the sample, and the measured spectrum is usually comprised of a discrete set of peaks corresponding to the frequencies of these modes.

US 2016/0139065, assigned to the assignee of the present application, discloses the technique of measuring one or more parameters of a sample. This technique utilizes hybridization approach according to which measurements providing information on the sample geometry (such as OCD and/or CD-SEM) are used in combination with Raman spectroscopy measurements in order to stabilize and verify the stress and composition distribution.

GENERAL DESCRIPTION

As described above, integrated structures became more complex with respect to a variety of materials and geometry (e.g. complexity of patterns and decrease in the dimensions of the pattern features). Therefore, there is a need in the art for a novel measurement technique that would desirably increase the amount of information about the structure, e.g. for controlling the patterning process applied to the structure.

The present invention takes advantage of Raman-based measurement technique recently developed and described in WO 2017/103934, assigned to the assignee of the present application. This technique utilizes detection of a Raman spectrum obtained from a patterned structure under measurements using selected optical measurement scheme(s) each with a predetermined configuration of illuminating and/or collected light conditions corresponding to the characteristic(s) to be measured; and determining distribution of Raman-contribution efficiency (RCE) within the structure to determine the characteristic(s) of the structure.

There is a need in the art for a novel metrology technique/tool capable of accurately measuring not only the average material properties, but also the spatial profile/distribution of these properties within a structure. This is especially true considering that the structure geometry itself can be viewed as the spatial distribution of electric/optic properties, so this capability can also be applicable to dimensional metrology.

The present invention is based on the inventor's understanding of the capabilities and limitations of Raman spectroscopy. More specifically, the Raman response of a specific volume element depends on the local properties of the material, such as composition, strain, crystallinity etc. The spatial distribution of these properties depends most importantly on the geometry of the structure (i.e. which materials occupy which space), but sometimes also on the subtler variation of properties within a single functional part of a structure (e.g. the spatial distribution of stress in a multilayer structure). However, the collected Raman signal integrates light coming from the entire illuminated volume, making the measurement of local properties a serious challenge for Raman spectroscopy, and in some cases even compromising the ability to measure average integrated properties.

The interpretation of Raman spectra can conceptually be divided into three levels, as follows: The first level relates to spectral separation of different materials. The Raman scattering from distinct materials, even if excited simultaneously, will generally have different spectral distributions which can be identified by someone trained in the art and separately quantified (e.g. by identifying peaks at specific locations known to belong to specific materials). This provides a high level separation of the signals coming from different materials in the structure, and can in some cases even allow for a quantitative estimation of the relative quantities of these materials.

The second level of interpretation relates to dependence of the Raman peaks and other features from each material on the specific properties of that material, including chemical properties (e.g. alloy composition, doping/impurities), and/or structural properties (e.g. crystal orientation and defect density, polycrystalline grain size distribution etc.), as well as physical conditions (e.g. stress, temperature). This dependence can be expressed through Raman peaks' locations, widths and shape distortions. This level of interpretation provides more detailed information compared to the first, but is usually still limited to average values over regions containing the same or similar materials. It requires on the other hand more refined measurement capability (in terms of spectral resolution and signal-noise ratio) and a theoretical or empirical model to support the interpretation of the measured spectra.

The third level relates to combining the information from multiple measurements, which probe different spatial regions of the sample. This can be achieved by varying any number of system parameters affecting the coupling of light into and out of the sample; these may include illumination wavelength, angle of incidence, polarization etc. By selectively exciting different parts of the sample, information regarding the spatial profile can be extracted, as will be described below. This type of interpretation requires an even more elaborate model which can predict the spatial distribution of sources contributing to the spectrum for a given set of system parameters, and the coupling of those sources to the detector. This kind of analysis is referred to as "profiling".

Among the different techniques mentioned above for Raman based profiling, using multiple source wavelengths is notable for reliably producing a marked effect on the excitation profile, while other methods may vary in effectiveness depending on the structure geometry. This is due to the strong dependence of the absorption coefficient on wavelength in the visible range for relevant materials, such as Si, Ge and others. However, due to the strict characteristics required of light sources for Raman spectroscopy—they need to be ultra-narrow band, have high beam quality and very stable—adding several such sources to a Raman system significantly increases system complexity and cost, making it impractical to have more than 2-3 wavelengths.

The present invention provides a novel approach for monitoring/measuring of spatial distribution/profile of various parameters/properties of a structure, and also a complex patterned structure, from detected Raman scattering/signature of the structure. It should be understood that the term "spatial profile" or "spatial distribution" relates not only to the property(ies) variation across the structure but also through the structure, and relates to both the material properties' and geometrical properties' distributions. This is of particular importance when dealing with multi-layer patterned structures, in which different measurement planes inside the structure may include different layer stacks and/or different patterns, with respect to both materials and geometry of the pattern features.

The approach of the invention relies on the dependence of various properties of a structure on temperature conditions of the structure. Such properties include for example, optical absorption of material composition, strain, stress, etc., which depend on temperature conditions up to some extent in all materials. The invention utilizes an effect of such temperature dependence of the structure's properties onto Raman scattering of the structure, and apply model-based processing to the detected Raman signatures at different temperature conditions to obtain information indicative of the spatial profile of one or more of the structure properties.

More specifically, the invention is used to apply the temperature changes to the structure under exciting illumination to controllably vary the absorption properties of the structure, and as a result the penetration of the source beam (exciting illumination) into the structure, and thus obtain information indicative of the spatial profile of the Raman sources (i.e. locations where Raman response is originated). Accordingly, the invention is described hereinbelow with respect to this specific application of the invention. It should, however, be understood that the principles of the invention are applicable for profiling of one or more other properties of the structure, provided that the optical properties dictating the electromagnetic field distribution are temperature-dependent which affects the Raman scattering, e.g. strain, stress, etc. For example, considering a solid Silicon wafer with a z-dependent strain, the technique of the invention can be used to separate the strain at different depths, by producing measurements with different penetration depths. To this end, one or more appropriate models may be used describing Raman scattering from a structure, where the required property(ies) and temperature are the model parameters.

Thus, the measurement technique of the invention is based on performing Raman spectroscopy under controllably varying temperature conditions of the structure. Considering a change in the penetration depth of the exciting illumination as a function of temperature change, this results in exciting different Raman sources in the structure. Analysis of the detected Raman responses of the excited regions/sources provides data indicative of the spatial profile of the patterned structure being measured.

According to one broad aspect of the invention, it provides a method for use in measuring one or more characteristics of patterned structures. The method comprises: performing measurements on a patterned structure by illuminating the structure with exciting light to cause Raman scattering of one or more excited regions of the pattern structure, while applying a controlled change of at least temperature condition of the patterned structure, and detecting the Raman scattering, and generating corresponding measured data indicative of a temperature dependence of the detected Raman scattering; and analyzing the measured data and generating data indicative of spatial profile of one or more properties of the patterned structure.

The controlled change of the temperature condition is implemented by controllably heating the pattern structure under illumination to affect corresponding change in optical absorption of materials of the patterned structure, e.g. local heating to affect the absorption change within the region(s) being illuminated. By this, a change of one or more properties of the structure is affected, e.g. a penetration depth of the exciting illumination is affected, and the measured data is therefore indicative of the excited/responding region(s) in the structure. Considering the patterned structure, and even more a complex patterned structure, a change of the absorption properties, and accordingly a change in the penetration depth, results in different Raman excitations causing variation of the Raman scattering.

The heating field may be applied via the intensity of the exciting illumination causing the Raman scattering, and/or auxiliary illumination applied to the excited region(s).

The entire structure may be measured by performing a plurality of measurement sessions on multiple measurement sites across the structure, e.g. selected sites. Generally, a number m of measurements ($m \geq 2$) is performed on n measurement sites ($n \geq 1$) using two or more different temperature conditions. The plurality of measurements may further include controllable variation of wavelengths of the illumination and/or angles of incidence of the illumination and/or polarization states of the illumination. As described above, the measured data is thus in the form of temperature dependent Raman responses of the structure, which is at times referred to herein below as "temperature profile of Raman scattering".

The controlled change of the temperature condition is preferably performed by monitoring the temperature of the structure/region under illumination. This may be implemented by analyzing spectral information in the temperature-dependent detected Raman scattering (e.g. using the principles of Raman thermometry).

According to another aspect of the invention, there is provided a system for measuring one or more characteristics of a patterned structure, the system comprising: a measurement system comprising: an illumination unit configured and operable to illuminate the patterned structure to cause Raman scattering of one or more excited regions of the patterned structure and to cause controllable variation of at least a temperature condition of the structure; and a detection unit comprising at least one optical detector configured and operable to collect the Raman scattering of the structure while under the controllably variable temperature conditions, and generate corresponding measured data; a control system configured to be in data communication with the measurement system, the control system comprising an analyzer configured and operable to receive the measured data and utilize data indicative of variation of the temperature condition, and apply to the measured data model-based processing and generate data indicative of a spatial profile of at least one property of the patterned structure.

As described above, such at least one property of the structure includes at least material property, and preferably also includes geometric profile of the structure.

The measurement system includes a light source system. In some embodiments, the light source system is configured and operable to produce an illuminating beam which has wavelength and intensity properties to cause both the Raman scattering and the controllable variation of the temperature condition of the structure, to thereby affect a penetration depth of the illuminating beam into the structure and excite the one or more regions to produce the Raman scattering. In some other embodiments, the light source system is configured and operable to produce separate light beams: an illuminating beam configured to excite the patterned structure to cause the Raman scattering and a heating light beam configured to cause the controllable variation of the temperature condition of the structure, to thereby affect a penetration depth of the illuminating beam into the structure and excite said one or more regions to produce the Raman scattering.

The illumination causing the Raman scattering is preferably continuous wave illumination.

The measurement system may be is configured and operable to vary one or more of the following measurement conditions: wavelengths of the illumination; angles of incidence of the illumination; and polarization states of the illumination.

The control system may be configured and operable to analyze the measured data and determine the data indicative of variation of the temperature condition from variation of one or more parameters in the Raman scattering data (e.g. peak intensity and/or peak spectral data such as wavelength and peak width).

The control system may also include and analyzer configured and operable to analyze the measured data by applying to the measured data one or more predetermined models describing Raman scattering from a structure, where temperature and the one or more selected property of the structure arc included in a set of model parameters.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIGS. 4A to 4E exemplify how the technique of the invention can be used for determining two-dimensional spatial profile of the structure from temperature profile of the Raman response, where FIG. 4A exemplifies a portion (e.g. measurement site) of a multi-layer patterned structure, FIGS. 4B and 4D show more specifically two different regions of the structure of FIG. 4A being measured, and FIGS. 4C and 4E show how the Raman spectra measured from the regions of FIGS. 4B and 4D, respectively, are modified with the temperature changes applied to the structure (or at least those regions thereof)

DETAILED DESCRIPTION OF EMBODIMENTS

The present invention provides a system for monitoring characteristics of patterned structures using Raman scattering from the structure while varying temperature conditions of the structure, to obtain temperature profile of the Raman signatures.

Figure 1:
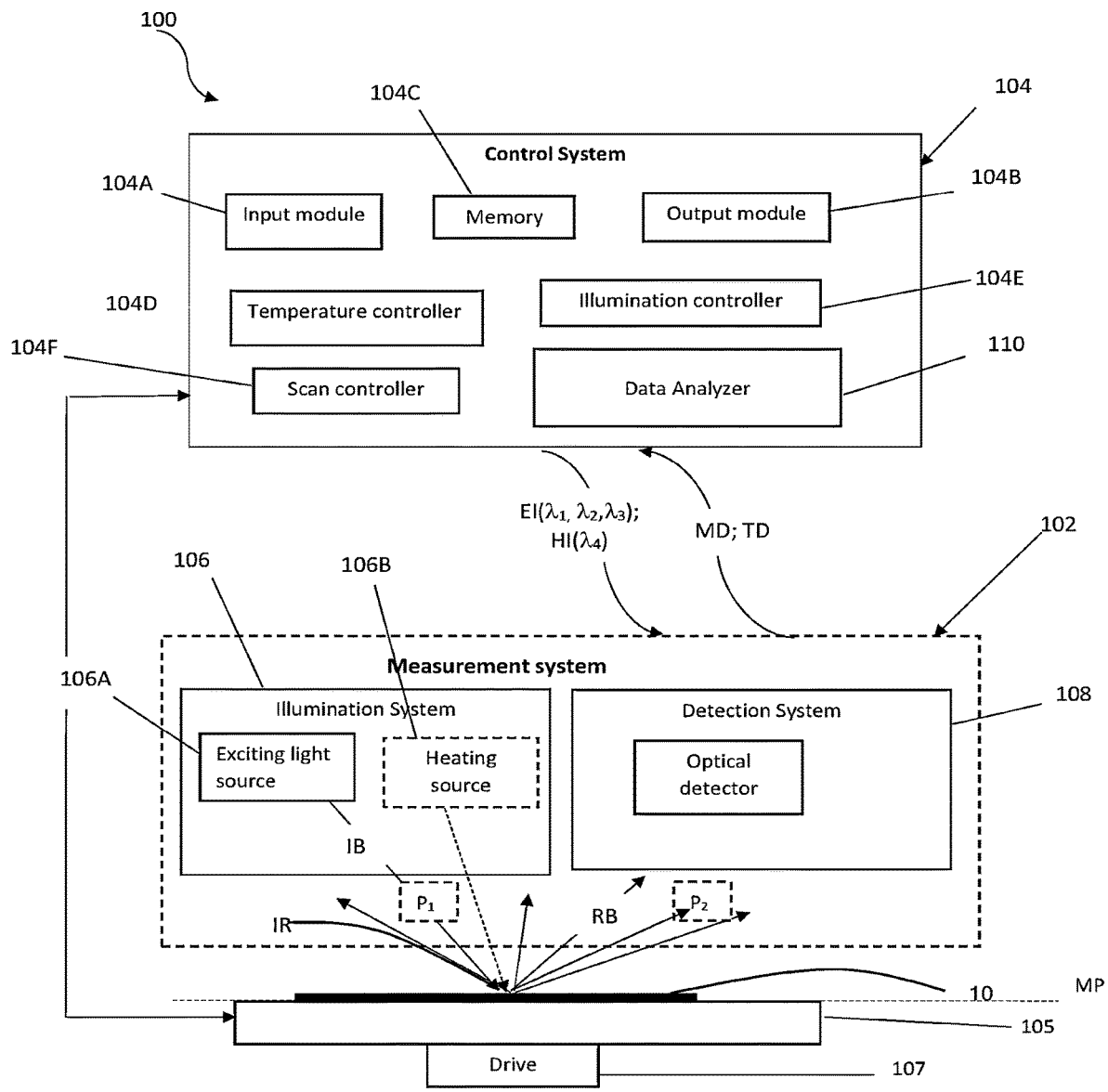
FIG. 1 is a block diagram of a system of the invention for measuring characteristics of patterned structure.

Referring to FIG. 1 there is illustrate, by way of block diagram, a system 100 according to the invention. The system 100 includes a measurement system/unit 102 and a control system 104 which are configured for data/signal communication between them (via wires or wireless signal connection using any known suitable communication equipment and protocols).

The measurement system 102 is appropriately mounted with respect to a stage 105, which defines a measurement plane MP for supporting a structure 10 under measurements, e.g. semiconductor wafer. The stage 105 typically has a drive unit 107 which has a mechanism configured and operable to adjust the z-position of the measurement plane with respect to the measurement system, and may also include mechanism(s) for linear movement along either one or both of X- and Y-axes and/or rotation in the X-Y-plane.

The measurement system 102 includes an illumination system 106 and a detection system 108, and a light focusing and collecting optics, as will be described below. The illumination system 106 includes a light source 106A (e.g. laser(s)) configured and operable to illuminate the patterned structure with exciting wavelengths to cause Raman scattering from one or more excited regions. Further, the illumination system 106 is preferably configured to illuminate at least the regions being excited by heating illumination, in order to cause controllable variation of a temperature condition of those regions.

It should be understood that, generally, for the purposes of the present invention, the entire structure under Raman-based measurements may be subject to controllably variable temperature conditions. Preferably, however, local heating of the regions being measured is used, by means of applied radiation. Further, as shown in the figure by dashed lines, an auxiliary heating light source 106B might be used. Alternatively or additionally, the local heating effect can be achieved by the same exciting beam produced by light source 106A which thus causes both the controllable change of the local temperature and corresponding Raman scattering. It should also be noted that different temperature conditions may be performed by continuously changing the temperature, or applying two or more different temperatures, as the case may be.

The measured data is thus in the form of temperature dependent Raman responses of the structure, which is at times referred to herein below as "temperature profile of Raman scattering". This will be exemplified more specifically further below.

The detection unit 108 includes one or more detectors (spectrometer(s)) configured and operable to receive the Raman scattering light and generate measured data MD indicative thereof. As described above, the Raman scattering is being detected during the controllably variable temperature conditions, e.g. two or more different temperatures. Accordingly, measured data MD is indicative of a temperature profile of the Raman scattering, i.e. is a function of Raman response wavelength(s) λ and temperature t°. As will be exemplified below, the temperature change affects absorption coefficient of the material, and accordingly affects a penetration depth of the exciting radiation, and thus the location at which the Raman response is originated. Therefore, such measured data) MD(λ,t°) provides a direct measure of the spatial distribution/profile of one or more properties of the structure, including both the material and geometric properties of the structure. Using model-based processing of such measured data provides for determining the parameters' distribution within the structure.

The system 100 is configured and operable to perform one or more measurement sessions on the patterned structure 10 to obtain data indicative of the spatial profile of the patterned structure 10. Each measurement session includes illuminating a region (focal spot) IR on the patterned structure 10 by continuous wave illuminating beam(s), IB, of exciting wavelength(s), while being concurrently heated by illumination to cause temperature changes within the region IR, to thereby cause Raman scattering/response(s) RB from differently located Raman sources within the illuminated region. For example, increase of temperature decreases the absorption coefficient for a certain wavelengths and thus decreases the penetration depth of the exciting illumination. Accordingly a different pattern inside the structure is being excited to cause the Raman response.

As described above, such heating may be achieved by the same exciting beam IB and/or by a separate heating beam HB whose intensity(ies) is/are appropriately controllably varied by the temperature controller 104D. It should be understood that in case the separate (auxiliary) heating light beam is used, the heating beam wavelength may be outside spectral range(s) used for Raman excitation, and may be continuous wave or pulsed beam. The controlled change of the temperature condition may be achieved by controlled variation of the intensity of the illuminating beam, either beam IB or beam HB or both of them, as the case may be, to thereby vary a heating field applied to the region being illuminated.

Such a temperature change (heating) results in a corresponding change in optical absorption of the illuminated region due to the strong dependence of the absorption coefficient of a medium on the temperature of said medium. Generally, the optical absorption of a medium affects light penetration depth into the medium. Thus, a change in the temperature condition causes a change in the optical absorption which results in a different location of the Raman source excited by the illumination (e.g. deeper location at lower temperature). Hence, the Raman responses (wavelengths) detected from multiple focal spots across the structure (by scanning) and the corresponding temperatures form together a spatial profile of the Raman scattering, which can be interpreted as the spatial profile of the source(s) of the Raman scattering.

The control system 104 includes data input and output utilities/modules 104A and 104B, memory utility 104C, and also includes a temperature controller 104D and illumination controller 104E which controllably modify the wavelength and temperature parameters/conditions during the measurements. The temperature controller 104D is configured and operable to monitor the temperature conditions of the excited/responding regions and provide respective temperature data TD enabling to associate the temperature parameters with the detected Raman scattering. To this end, the temperature controller 104D may utilize any known suitable temperature measurement techniques. For example, the principles of Raman thermometer can be used.

One known method of Raman thermometer is based on the fact that the material's temperature can affect the peak position of Raman bands. Thus, when a Raman band shifts significantly with temperature, the monitoring of the peak position can be the most straightforward manner of determining temperature provided the Raman spectrometer has sufficient spectral resolution. According to another method, the temperature can be determined from a ratio of the Stokes and anti-Stokes signal strengths of a given Raman band. For the latter method, the detector is capable of detecting light at wavelengths longer and shorter than that of the exciting light source (laser).

Thus, if a Raman band is sufficiently narrow, the peak position (wavelength) can be seen to shift with the temperature. As the temperature increases, the bond length increases and consequently the energy of the vibrational mode decreases; a decrease in temperature leads to a shorter bond length and an increase in the energy of the vibrational mode. The increase or decrease in bond length causes a change in the vibrational force constant, which results in a shift of the Raman peak position. An other way of determining the temperature is by measuring the signal strengths of a particular Raman band at the Stokes and anti-Stokes positions and calculate the temperature based on a Boltzmann distribution of the ground and first excited state populations, according to the relation $$\frac{I_{anti-stokes}}{I_{stokes}} = \left(\frac{\omega_{photon} + \omega_{phonon}}{\omega_{photon} - \omega_{phonon}}\right)^4 e^{-\frac{\hbar\omega_{phonon}}{kT}}$$

Here, $I_{stokes}$ and $I_{anti-stokes}$ are measured intensities of Stokes and anti-Stokes photons in the Raman spectra, $\omega_{photon}$ and $\omega_{phonon}$ are the frequencies of the exciting light and of the excited Raman mode, and T is the temperature.

The Raman thermometry is generally known and does not form part of the invention, and therefore need not be described in more details, except to note that for the purposes of the present invention, which is aimed at determining the spatial profile of Raman scattering from the temperature profile of such scattering, the same Raman response can be appropriately analyzed to determine such information as the responding material, the corresponding temperature and the material location in the structure, as will be described further below.

The control unit 104 may also include a scan controller 104F. In this connection, it should be noted that the entire structure can be measured by using a scan mode, by providing a relative displacement between the stage 105 and an optical head (not shown here) of the measurement system 102. This can be achieved by moving the stage 105 and/or at least some elements of the optical head. The stage 105 may be a so-called X-Y-stage or r,θ-stage. For example, considering the geometrically symmetric structures (e.g. disk-like structures, as semiconductor wafers), the r,θ-stage can be used and the measurements are performed by scanning the first half of the structure using linear movement(s) of the stage and/or optics, and then 180° rotation of the stage and repeat the scan of the second half of the structure. As described above, and illustrated in the figure, the respective drive circuits/mechanisms of the stage and/or measurement system are appropriately connected to the scan controller 104F of the control system 104.

The system 100 also includes a data analyzer 110, which may be a part (module) of the control system 104, or may be a separate device, as the case may be. The data analyzer 110 is in data communication with the detection unit 108 and with the illumination and temperature controllers 104E and 104D to controllably operate the illumination and the heating conditions (i.e. appropriately vary the exciting wavelengths and intensities, $EI(\lambda_1, \lambda_2, \lambda_3)$) and heating wavelength and intensity, $HI(\lambda_4)$, during measurement sessions, and to receive the measured/detected Raman scattering MD and the temperature data TD, and generate data indicative of a spatial profile of material properties of the patterned structure.

It should be understood that the technique of the invention is neither limited to a number of exciting wavelengths nor that of the heating radiation, in case a separate heating light beam is used, and the exciting wavelengths $\lambda_1$, $\lambda_2$, $\lambda_3$ and heating wavelength $\lambda_4$ are exemplified here just in order to emphasize that multiple exciting wavelengths are used to excite various different Raman sources and that the wavelength of the heating beam, if used, may be different from the exciting wavelengths.

Figure 2:
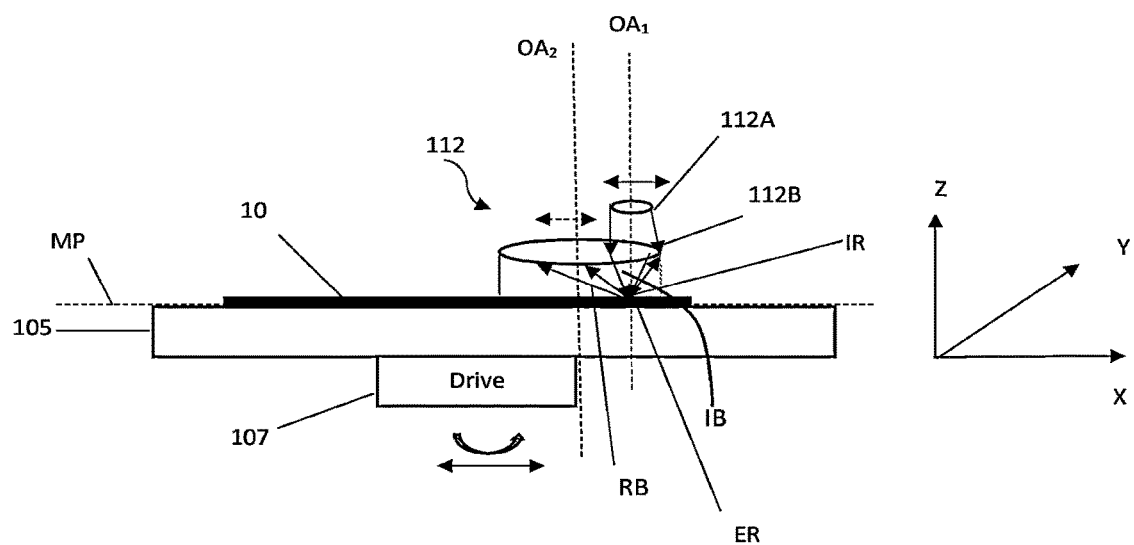
FIG. 2 exemplifies an optical scheme suitable for use in the system of FIG. 1.

Reference is made to FIG. 2 which exemplifies an optical head 112 (or a part thereof) and a light propagation scheme suitable for use in the measurement system 102. The optical head 112 includes at least an objective lens 112B having an optical axis $OA_2$, which is located in a common path of illumination and collection channels and focuses illuminating beams IB propagating from light source(s) onto an exciting region ER and collects Raman scattering beams RB to be directed to the detector 108.

As exemplified in the figure, the optical head 112 may also include a lens 112A located in the optical path of illuminating beam IB upstream of the objective 112B, and having a numerical aperture larger than that of the objective. Moving the lens 112A along the X-axis with respect to objective 112B within the field of view of objective 112B provides for angular scanning or angle resolve measurements (different angles of incidence) of the illuminating beam onto the structure.

For example, considering a measurement session as corresponding to a fixed relative position between the stage 105 and the objective 112B, multiple measurements with different angles of incidence can be taken from regions IR by moving the lens 112A along a distance corresponding to the lateral dimension of the objective 112B. Also, for example, during these multiple measurements or a single measurement within the same measurement session (i.e. for the same illuminated region IR), the temperature conditions and/or the wavelengths can vary, resulting in a temperature profile (temperature dependence) of Raman responses per measurement session. Then, the relative movement between the stage and the optical head is performed to implement the scan mode, and the next measurement session is performed, during which lens 112A may or may not be moved with respect to objective 112B, as described above. The measured data obtained/detected during the complete scan is thus a function of wavelength and location across the structure (in the X-Y-plane), and is also a function of temperature, and thus provides material information through the structure (along Z-axis), resulting in a spatial profile of Raman scattering (material-related and geometrical information).

Figure 3:
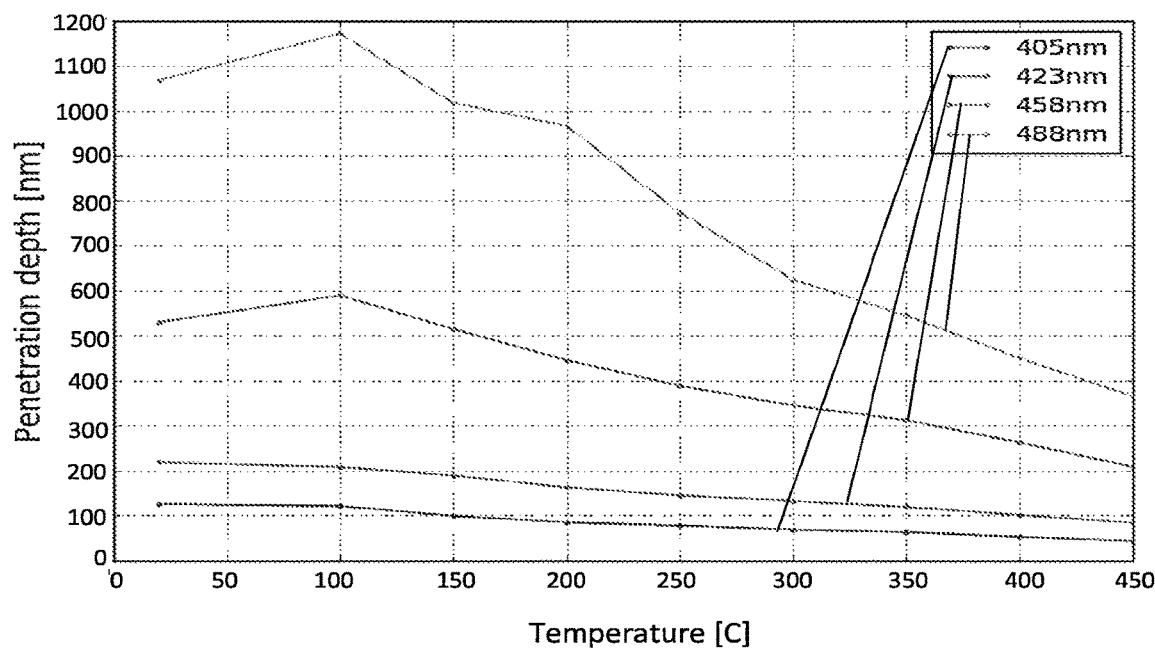
FIG. 3 exemplifies dependence of the penetration depth of radiation through a material on the temperature conditions of the material.

Temperature dependent absorption properties n&k (refractive index & extinction coefficient) can be used to determine the penetration depth. For example, the inventor used such data for crystalline Silicon as a representative material [Vuye et al. (1993), *"Temperature dependence of the dielectric function of silicon using in situ spectroscopic ellipsometry"*, Thin Solid Films 233, 166-170 (1993)] to calculate the penetration depth as $\pi^{-1} = \lambda/4\pi k$. FIG. 3 illustrates optical penetration depth in Si vs. temperature for some typical wavelengths, 405 nm, 423 nm, 458 nm, 488 nm, used in Raman Scattering. As can be seen, temperature changes going from room temperature to about 300-400 C causes an about two-fold change in the penetration depth.

With regard to a heat source, as described above, any way to heat the structure under measurements can be used, such as placing the entire structure in a temperature controlled enclosure. This has an advantage of producing a known uniform temperature throughout the measured device. However, it might not be well suited to a production environment where measurement time and equipment cost are important. The invention therefore may utilize a different method using heat dissipation from either the Raman excitation beam itself, or an auxiliary laser beam at a different wavelength (e.g. in the near infra-red) which does not interfere with the Raman signal and is only used for local heating of the sample. This approach, although it might result in that the temperature profile is highly non-uniform and has to be modeled in addition to the electromagnetics for the data to be successfully interpreted, is advantageous with regard to a fast response and fine control of the average heat flux over a wide range.

It should also be noted, although not specifically shown, that the measurement system may include various other optical elements, including light directing elements, such as one or more of the following: re-directing mirrors, optical fibers, wavelength selective elements, e.g. dichroic mirror(s), beam splitters(s).

Also, as shown in FIG. 1, the measurement system 102 may include polarizers $P_1$ and $P_2$ in the illumination and collection channels. For example, Raman scattering signal may be filtered by acquiring spectra with polarization which is either parallel or perpendicular to the polarization of the excitation light produced by polarizer $P_1$. To this end, polarizer $P_2$ may be inserted in the beam path between the measurement plane MP (structure) and the detector 108 (spectrometer), allowing the Raman polarization to be selected. The polarization of the illuminating beam can also be kept in its normal state, rotated by 90°, or 'scrambled' to remove any polarization by inserting polarizing optics $P_1$ between the light source (laser) 106A and the structure. Polarization measurements also provide useful information about molecular shape and the orientation of molecules in ordered materials, such as crystals, polymers and liquid crystals.

Reference is now made to FIGS. 4A to 4E exemplifying how the principles of the invention can be used for determining the two-dimensional spatial profile of the structure (i.e. across and through the structure) from a temperature profile of the Raman response. Here. FIG. 4A exemplifies a portion (measurement site) 116 of a multi-layer patterned structure 10, such as a semiconductor wafer, which in the present not limiting example is formed by layers $L_1$, $L_2$, $L_3$ made of different materials 1, 2 and 3, respectively. Layer $L_2$ is located on top of substrate layer $L_1$, and layer $L_3$ is located in top of layer $L_2$ and is patterned forming an array of spaced-apart regions of material 3. Measurements are exemplified as being performed on two regions of different types, i.e. having different layer stacks and/or different patterns. In the present example, one region 116A includes the line-feature of material 3 (FIG. 4B) and the other region 116B has no such feature, e.g. a space-feature of layer $L_3$ pattern (FIG. 4D). FIGS. 4C and 4E show how the Raman spectra of the materials included in the portions 116A and 116B, respectively, are modified with the temperature changes.

Thus, region 116A includes layer $L_1$ (substrate) made of Material 1, layer $L_2$ of Material 2, and layer $L_3$ of Material 3, shown in FIG. 4B. Region 116B includes substrate layer $L_1$ of Material 1 and layer $L_2$ of Material 2, as shown in FIG. 4D. The Raman response of a specific volume element within the portion 116A being measured depends on the local properties of the materials 1, 2 and 3, such as composition, strain, crystallinity etc., which are effectively embodied in the Raman tensors assigned to that volume. Similarly, the Raman response of portion/region 116B depends on the local properties of the materials 1 and 2. As described above, the spatial distribution of these properties depends on the geometry of the structure (i.e. which materials occupy which space), but sometimes also on the subtler variation of properties within a single functional part of a structure (e.g. the spatial distribution of stress in an etched Si line structure). The collected Raman signal/response is integrated over the entire illuminated volume, making the accurate measurement of local properties a serious challenge for Raman spectroscopy.

Each of FIGS. 4C and 4E shows two Raman responses, $I_1(\lambda)$ and $I_2(\lambda)$, of the volume/portion 116A/116B measured under different temperature conditions $T_1$ and $T_2$, respectively. As seen in FIG. 4C, both graphs have Raman peaks $R_1$, $R_3$ and $R_2$ corresponding to Materials 1, 2 and 3, respectively. Heating of the portion 116A from $T_1$ to $T_2$ temperature condition affects the entire Raman response/signature, while differently affecting the Raman peaks of three materials: the spectral characteristics of the Raman peak of material 2 (i.e. wavelength and peak width) remain almost unchanged but intensity is slightly reduced, the Raman peak of material 1 shows significant reduction in the intensity and a detectable spectral shift with almost unchanged peak width, and the Raman peak of material 3 is changed, although insignificantly, in all three parameters—spectral shift, peak width, and intensity. Such a change in the Raman signature may explained/interpreted as follows: at higher temperature $T_2$, the penetration depth of the illuminating beam is lower, and accordingly the Raman response of substrate material 1 in the detected signal is lower than at the lower temperature $T_2$; the excitation of material 3 is oppositely affected by the heating; and that of material 2 is almost unaffected. As for the Raman signature measured on portion/volume 116B shown in FIG. 4E, both graphs $I_1(\lambda)$ and $I_2(\lambda)$ have Raman peaks $R_1$ and $R_2$ corresponding to Materials 1 and 2, respectively. Increase of temperature from $T_1$ to $T_2$ results in the almost unchanged Raman peak $R_2$ of material 2 with slightly increased intensity and significantly increased intensity of Raman peak $R_1$ of material 1 with some spectral shift of the peak. For both volumes 116A and 166B, the temperature difference $\Delta t=(T_2-T_1)$ can be determined from the peak shift of material 1, and plugged/injected into a Raman response model to obtain the corresponding field distributions at different temperatures.

The following is an example of the interpretation of the detected Raman spectra according to the above-described three levels of data interpretation.

As described above, Raman scattering from distinct materials, even if excited simultaneously, will generally have very different spectral distributions which can be identified and separately quantified. This makes a high level separation of the signals coming from different materials in the structure, and can even allow an estimation of the relative volume of these materials across the structure. Also, as described above, the Raman peaks and other features from each material depend on the specific properties of that material and physical conditions (e.g. temperature, stress). This dependence can be expressed through peak locations, widths and shape distortions, as exemplified in FIGS. 4C and 4E.

Combining the information from multiple measurements, which probe different spatial regions of the structure is achieved by varying system parameters affecting the interaction of light with the structure (e.g. coupling light into and out of the structure), such as wavelength, angle of incidence, polarization etc.

Let us consider the structure as being characterized by a discrete set of N parameters $P_i$, such as various geometrical and material quantities. In special cases this set can be decoupled such that small subset of measured parameters (e.g. the positions of only one or two peaks) can be used to measure a corresponding subset of parameters (e.g. the composition of a specific material in the sample). The measured data acquired by one Raman measurement can be described by some vector of quantities, $Y_j$, that can be raw spectral data, or fitted parameters extracted by model-based processing that data.

The measured values Y are related to the sample parameters P through an operator $\mathcal{M}$, such that $Y = \mathcal{M} P$. Extracting the parameters can now be thought of as inverting the operator $\mathcal{M}$, which can be done using well known methods. To this end, the problem is to be well-posed (i.e. to have a higher number K of independent measurements than the number N of parameters, K>N), and the operator $\mathcal{M}$ is to be known. This requires modelling of light-matter interaction in order to predict the electromagnetic field distribution inside the structure. For the technique of the invention, thermal modelling is also required to account for the temperature dependence of optical and elastic properties.

With regard to the "well-posedness" of the inverse problem, it should also be noted that measurements can sometimes be strongly dependent or correlated (if for example the wavelength or angle of incidence AOI is changed by a negligible amount, one cannot really gain new information, since the difference between measurements is lost in the measurement noise). Therefore, the requirement for a high number of measurements is to be actually replaced by a metric such as the "condition number" used in linear algebra. For example, considering the spatial distribution of a material, the different field distributions probed at different configurations (i.e. temperatures in this case) is to be sufficiently different, i.e. orthogonal, to each other. Such orthogonality might be difficult to achieve using only external beam parameters such as angle of incidence or numerical aperture, and very costly to achieve using many different exciting wavelengths. The present invention, utilizing measurement of the temperature profile of Raman scattering, provides a relatively cost-effective and robust solution to this problem.

Figure 5:
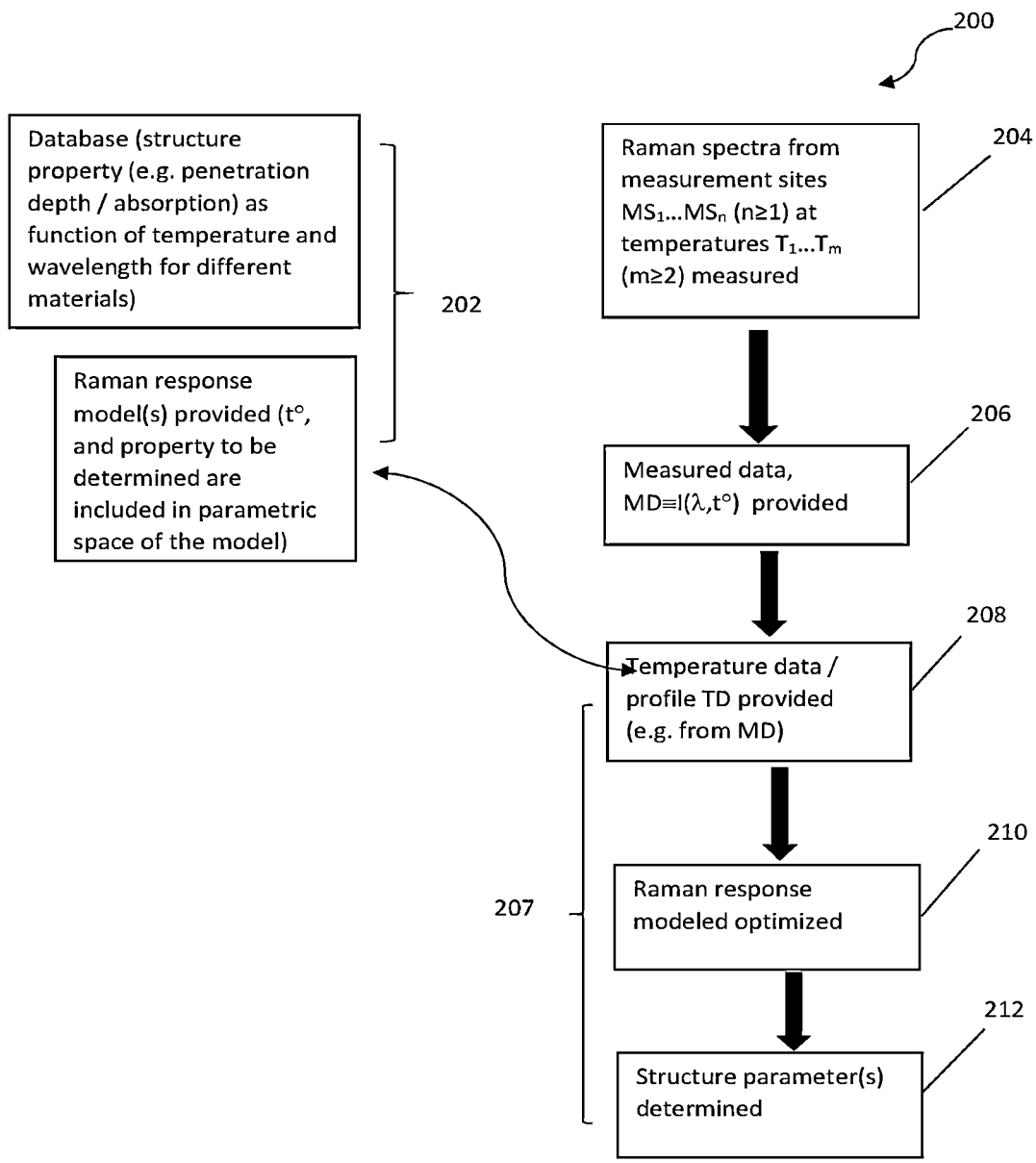
FIG. 5 exemplifies a flow diagram of a method of the invention for measuring structure parameters.

FIG. 5 illustrates, in a self-explanatory manner, a flow diagram 200 of a method of the invention using the above described technique to determine parameter(s) of a structure being measured from spatial profile of Raman scattering. The method utilizes known data (e.g. previously prepared and stored in database) about dependence of the structure property/condition of interest (illumination penetration depth/absorption), as function of temperature and wavelength for different materials, and one or more respective models of Raman scattering—step 202. As described above, the model describes/provides theoretical data of Raman scattering within a parametric space of the model, where the structure property/condition and the temperature are include in the model' parameters.

Measured data is provided (step 206) and processed (step 207), as described above. The processing may be performed in an on-line mode, or off-line mode using measured data previously obtained and stored. The measured data MD is a function of at least such parameters as wavelength and temperature. For example, measurements may be applied to n measurement sites of a structure using m different temperatures—step 204. The temperature data TD is determined, e.g. from the measured Raman spectra, as described above (step 208), and used to optimize the Raman scattering model (step 210). Then, the optimized model is used to determine, via fitting procedure, the structure parameter (s)—step 212.

I claim:

1. A method for use in measuring one or more characteristics of a patterned structure, the method comprising:
performing measurements on a patterned structure by illuminating the patterned structure with exciting light to cause Raman scattering of one or more excited regions of the patterned structure, while applying a controlled change of a temperature condition of the patterned structure and while monitoring the temperature condition of the patterned structure;
collecting the Raman scattering, by a detection unit, and generating measured data; and
generating, utilizing the measured data, data indicative of spatial profile of one or more properties of the patterned structure;
wherein the measured data is a temperature dependent Raman response of the patterned structure, and
wherein said monitoring of the temperature comprises analyzing the temperature dependent Raman response of the patterned structure and determining the controlled change of the temperature condition from a variation of at least one of (a) Raman scattering peak intensity, (b) Raman scattering peak wavelength, or (c) Raman scattering peak width.

2. The method according to claim 1, wherein said one or more properties of the patterned structure include at least one of material and geometric properties of the patterned structure.

3. The method according to claim 2, wherein said applying the controlled change of the temperature condition comprises controllably heating the patterned structure under illumination to affect corresponding change in optical absorption of materials of the patterned structure within at least said one or more excited regions, thereby changing penetration of exciting illumination into the patterned structure, the measured data being therefore indicative of a spatial profile of sources of the Raman scattering within said one or more excited regions in the structure.

4. The method according to claim 3, wherein the regions of the patterned structure at different penetration depths are different from one another in at least one of the following: layer stacks and patterns.

5. The method according to claim 1, wherein said controlled change of the temperature condition is performed by heating of the patterned structure.

6. The method according to claim 1, comprising performing a plurality of the measurement sessions while varying one or more of the following measurement conditions: wavelengths of the illumination; angles of incidence of the illumination; and polarization states of the illumination.

7. The method according to claim 1, wherein said illumination of the patterned structure to cause Raman scattering of one or more excited regions of the pattern structure comprises optical beams of two or more selected wavelengths.

8. The method according to claim 1, wherein said spatial profile of the one or more properties of the patterned structure is a two-dimensional profile of said at least one property distribution across and through the structure.

9. The method according to claim 1, comprising determining the change of the temperature condition from the variation of the Raman scattering peak intensity.

10. The method according to claim 1, comprising determining the change of the temperature condition from the variation of the Raman scattering peak wavelength.

11. The method according to claim 1, comprising determining the change of the temperature condition from the variation of the Raman scattering peak width.

12. A system for measuring one or more characteristics of a patterned structure, the system comprising:
a control system; and
a measurement system that comprises an illumination unit and a detection unit;
wherein the illumination unit is configured and operable to illuminate the patterned structure to cause Raman scattering of one or more excited regions of the patterned structure and to cause a controllable change of a temperature condition of the patterned structure;
wherein the detection unit comprises at least one optical detector configured and operable to collect the Raman scattering of the structure while under the controllable change of the temperature condition, and generate corresponding measured data; and
wherein the control system is configured to be in data communication with the measurement system, to monitor the temperature condition of the patterned structure, to receive the measured data, and to utilize the measured data to generate data indicative of a spatial profile of at least one property of the patterned structure;
wherein the measured data is a temperature dependent Raman response of the patterned structure, and wherein the control system is configured and operable to monitor the temperature condition by analyzing the temperature dependent Raman response of the patterned structure and determine the controlled change of the temperature condition from a variation of at least one of (a) Raman scattering peak intensity, (b) Raman scattering peak wavelength, or (c) Raman scattering peak width.

13. The system according to claim 12, wherein the control system is configured and operable to determine the change of the temperature condition from a variation of a Raman scattering peak intensity.

14. The system according to claim 12, wherein the control system is configured and operable to determine the change of the temperature condition from the variation of the Raman scattering peak wavelength.

15. The system according to claim 12, wherein the control system is configured and operable to determine the change of the temperature condition from a variation of a Raman scattering peak width.

* * * * *